United States Patent [19]

Wake

[11] Patent Number: 5,446,751

[45] Date of Patent: Aug. 29, 1995

[54] OPTOELECTRONIC DEVICE

[75] Inventor: David Wake, Ipswich, United Kingdom

[73] Assignee: British Telecommunications public limited company, London, England

[21] Appl. No.: 946,465

[22] PCT Filed: May 1, 1991

[86] PCT No.: PCT/GB91/00702

§ 371 Date: Nov. 18, 1992

§ 102(e) Date: Nov. 18, 1992

[87] PCT Pub. No.: WO91/17575

PCT Pub. Date: Nov. 14, 1991

[30] Foreign Application Priority Data

May 1, 1990 [GB] United Kingdom ............... 9009726

[51] Int. Cl.$^6$ ............................................. H01S 3/19
[52] U.S. Cl. ..................................... 372/46; 257/80; 372/45; 372/50; 437/129
[58] Field of Search ........................ 372/45, 46, 50; 437/129; 257/12, 13, 79, 80, 94, 98

[56] References Cited

U.S. PATENT DOCUMENTS 4,163,952  8/1979  Thompson et al. ............... 331/94.5

OTHER PUBLICATIONS

*Electronics Letters*, vol. 21, No. 13, 20 Jun. 1985, Stevenage, GB, pp. 571–573; Dutta et al: "Fabrication and Performance Characteristics of InGaAsP Ridge-Guide Distributed-Feedback Multi-Quantum-well Lasers".
*Patent Abstracts of Japan*, vol. 13, No. 346, Aug. 1989 & JP A 1 103 893 (Matsushita Electric Ind. Co. Ltd.) 20 Apr. 1989.
*Journal of Crystal Growth*, vol. 95, No. 1–4, Feb. 1989, Amsterdam, NL pp. 167–170; Andrews et al: "Selective Area of Growth of Indium Phosphide Based Heterostructures by Metalorganic Molecular Beam Epitaxy".
*Patent Abstracts of Japan*, vol. 14, No. 207 (P-1043) 26 Apr. 1990 & JP A 2 046 406 (Seiko Epson Corp.) 15 Feb. 1990.
*Patent Abstracts of Japan*, vol. 14, No. 248 (E-933) 28 May 1990 & JP A 2 071 575 (Seiko Epson Corp.) 12 Mar. 1990.
*Patent Abstracts of japan*, vol. 12, No. 24 (E-576) 23 Jan. 1988 & JP A 62 179 790 (Seiko Epson Corp.) 6 Aug. 1987.
*Electronics Letters*, vol. 22, No. 21, 9 Oct. 1986, Stevenage, GB, pp. 1117–1118; Kurobe et al: "Sumbilliampere Lasing of Zn-Diffused Mesa Buried-Hetero AlxGal-x-As/GaAs Multi-Quantum-well lasers at 77K".
*Patent Abstracts of Japan*, vol. 8, No. 226 (E-272) 1663) 17 Oct. 1984 & JP A 59108386 (Fujitsu K. K.) 22 Jun. 1984.
*Electronics Letters*, vol. 25, No. 15, 20 Jul. 1989, Enage GB, pp. 954–956; Matsui et al: "GaInAsP/InP Mass Transport Laser Monolithically Integrated With Photodetector Using Reactive Ion Etching".
*Transactions of teh Institute of Electronics and Communication*, vol. E69, No. 4, Apr. 1986, Tokyo JP, pp. 392–396; Hirose et al: "An Array of GaAlAs Composite-Cavity Lasers Monolithically Integrated With Photodetectors".
*Patent Abstracts of Japan*, vol. 13, No. 106 (E-726) 14 Mar. 1989 & JP A 63 278 289 (Hitachi Ltd.) 15 Nov. 1988.
*elctronics Letters*, vol. 26, No. 15, 19 Jul. 1990, Stevenage GB, pp. 1166–1168; Wake et al: "Monolithic Integration of 1.5 um Optical Preamplifier and Pin Photodetector With A Gain of 20dB and a bandwidth of 35Ghz".
PCT International Search Report PCT/GB91/00702, Jan. 1992.

*Primary Examiner*—James W. Davie
*Attorney, Agent, or Firm*—Nixon & Vanderhye

[57] ABSTRACT

An optoelectronic device includes a first n-type epitaxial layer, an active layer having a second epitaxial layer grown on said first layer and a third epitaxial layer of p-type material in the form of a ridge structure selectively grown on or over the active layer, in which a p-n junction is formed in the active layer between a region of p-type material aligned beneath the ridge, and adjacent n-type regions of the active layer, the underlaying first layer being wholly n-type. A method of fabricating such a device involves growing an all n-type planar, forming a dielectric mask thereon, growing by selective epitaxy the ridge structure of p-type material and simulatneously forming the p-n junction by diffusion thereon.

49 Claims, 5 Drawing Sheets

OPTOELECTRONIC DEVICE

BACKGROUND OF THE INVENTION

1. Field of the Invention

The present invention relates to optoelectronic devices, in particular but not exclusively to the integrated combination of a laser amplifier and an optical detector, and to a method of making such devices.

Such devices are of use, for example, in optical communications.

2. Related Art

As the demand for telecommunications services increases, the demand for high-capacity transmission systems also increases. To meet this demand the large bandwidth of optical fibres will need to be used much more efficiently in the future than in present optical communications systems.

Currently one of the principal limitations in the development of high-bandwidth optical communications systems is the availability of sensitive wideband optical receivers.

Present receiver designs tend to have either good sensitivity or wide bandwidth, but not both. Wideband receivers based on PIN photodiodes suffer from low sensitivity, whereas those based on avalanche photodiodes (APDs) are limited by gain-bandwidth product.

One approach to overcoming these limitations is to use a PIN photodiode receiver but to improve the receiver's sensitivity by preamplifying the incoming signals using a laser amplifier, as described in the paper by I. W. Marshall and M. J. O'Mahony, Electronics Letters, Vol. 23, pp 1052-1053, 1987. In this arrangement, a travelling wave semiconductor laser amplifier (TWSLA) and a PIN photodiode are packaged in hybrid form with intermediate collection and focussing optics, which optics may include a narrowband optical filter for noise reduction.

While the performance of that receiver was commendable—an equivalent input noise of 1 p A Hz$^{-\frac{1}{2}}$ with a 3 dB bandwidth of 10 GHz, and a sensitivity at 15 GBit/s of −27 dBm, it would be desirable if similar or better performance could be achieved without the need for focussing optics and hybrid construction.

In theory it would be a trivial matter to combine a laser amplifier and a photodetector in a single integrated component. Indeed, such structures already exist, albeit that the laser component is optimised for use as a resonant device rather than as an amplifier.

Maturer reflection suggests, however, that perhaps the production of a high performance integrated component is not quite so simple!

The laser/detector combinations which are known in the art have all been produced essentially as laser sources with integrated, and hence pre-aligned, back-facet detectors. Such detectors, which were used for laser control purposes, do not need to have any high speed capabilities. Even so, it was found that, in general, the performance of the laser was compromised by the need to produce a detector in the same process. Consequently, such laser/detector combinations, while common in the late 1960s and through the 1970s, are no longer in favour. Nowadays with the higher demands on laser performance, it is apparently deemed not practical or not worthwhile producing integrated laser devices. Moreover, in general the added processing complexity occasioned by the production of two device types in a single processing sequence leads to an unacceptable reduction in yield.

It is believed that many research groups around the world have tried to produce an integrated laser amplifier/PIN, but have found the problem too intractable. Meanwhile of course, others have been working on improving the performance of APDs, discrete PIN photodetectors, and discrete laser amplifiers. A further alternative to the problem of low receiver sensitivity is to use semiconductor laser amplifiers or fibre-laser amplifiers, such as erbium amplifiers, in the fibre link to increase the signal level reaching the receiver.

Very surprisingly, despite the seeming intractability of the problem, we have devised an integrated laser amplifier/PIN which not only offers very high levels of performance, but is also very simple to fabricate.

According to a first aspect the present invention provides an optoelectronic semiconductor device comprising a first epitaxial layer grown on a semiconductor substrate, a second epitaxial layer grown on said first layer and having a higher refractive index than that of the first layer and a third epitaxial layer in the form of a ridge structure selectively grown on or over said second layer, wherein said first epitaxial layer is of a first conductivity type, said third epitaxial layer is of a second conductivity type and a p-n junction is formed in said second epitaxial layer between a region of material of said second conductivity type, which is aligned beneath said ridge, and adjacent regions of said first conductivity type of said second layer.

SUMMARY OF THE INVENTION

According to a second aspect the present invention provides a method of fabricating an optoelectronic device, the method comprising the steps of:

growing a first epitaxial layer of a first conductivity type on a semiconductor substrate;

growing a second epitaxial layer of said first conductivity type on said first layer;

forming a dielectric layer on or over said second layer;

defining a pattern in said dielectric layer;

using selective epitaxy to grow a third epitaxial layer on semiconductor exposed by the patterned dielectric, said third epitaxial layer including at least one ridge structure; and diffusing a dopant from said third epitaxial layer into said second layer thereby selectively type-converting regions of said second layer thereby forming a p-n junction therein without type converting underlying parts of said first epitaxial layer.

According to a third aspect the present invention provides a method of fabricating an optoelectronic device, the method comprising the steps of:

i) growing a planar of a first conductivity type comprising a waveguiding layer and overlying said waveguiding layer with an active layer;

ii) forming an inorganic dielectric layer on said planar;

iii) patterning said dielectric layer to expose underlying semiconductor;

iv) using selective epitaxial growth to grow material of a second conductivity type on said exposed semiconductor, the selective epitaxial growth including at least one ridge; and v) simultaneously with step iv) diffusing dopant from said material of a second conductivity type into the planar to form a predetermined arrangement of p-n junctions therein, including a lateral p-n junction aligned with said ridge.

In embodiments of the present invention, the ridge, ridges, ridge structure or ridge structures have generally the effect of providing optical confinement in the lateral direction, in the planar structure below them in the opto electronic device. Optical confinement perpendicular to that can be provided by differences in refractive index of the layers of that planar structure, for instance between the first and second epitaxial layers, or between the active and waveguiding layers. When optical radiation is guided, as a result, along an optical path in the planar structure which lies below and parallel to the ridge, ridges, ridge structure or ridge structures, it may be preferable to take steps to prevent reflection of that optical radiation back into the optical path, at an end of the device. In particular, for instance, if there are two ridges or ridge structures, a first being subject to an applied voltage to forward bias it, hence providing gain, and a second being subject to an applied voltage in the opposite sense, hence providing photo detection, it may be preferable that optical radiation entering the photo detecting portion of the device should not be reflected back into the photo detecting portion, once having exited therefrom.

To this end, a cleaved exit face of the photo detecting portion may be anti-reflection coated or, alternatively, there may be a part of the opto-electronic device which provides reduced or no waveguiding effect adjacent an exit area of the photo detecting region. This latter can be achieved relatively simply by terminating a ridge or ridge structure short of the edge of the device so that part of the planar structure extends without optical confinement in the lateral direction, beyond the end of the ridge or ridge structure. Any optical radiation propagating along the optical path below the ridge or ridge structure will tend to diffract (or generally spread out) in that extension of the planar structure, rather than being reflected back into the optical path as might otherwise occur.

Although the aspects of the present invention which are set out above are expressed in general terms with respect to the conductivity types present, such that a dopant present in the third epitaxial layer might be either p-type or n-type, only dopants of high mobility (such as zinc) are likely to be found practical for use in the third epitaxial layer. In current technology, this may mean that only embodiments in which the first conductivity type is n-type and the second conductivity type is p-type will be found practical. This matter is further discussed with reference to the embodiment of the present invention shown in FIG. 1 and 5.

It should be noted that although expressions such as "overlying" which might indicate a specific orientation are used in this specification, they are for ease of description only and are not generally intended to indicate any specific orientation, in use of a device or otherwise.

BRIEF DESCRIPTION OF THE DRAWINGS

Preferred embodiments of the invention will now be described by way of example only, with reference to the accompanying drawings in which.

DETAILED DESCRIPTION OF EXEMPLARY EMBODIMENTS OF THE INVENTION

Figure 1:
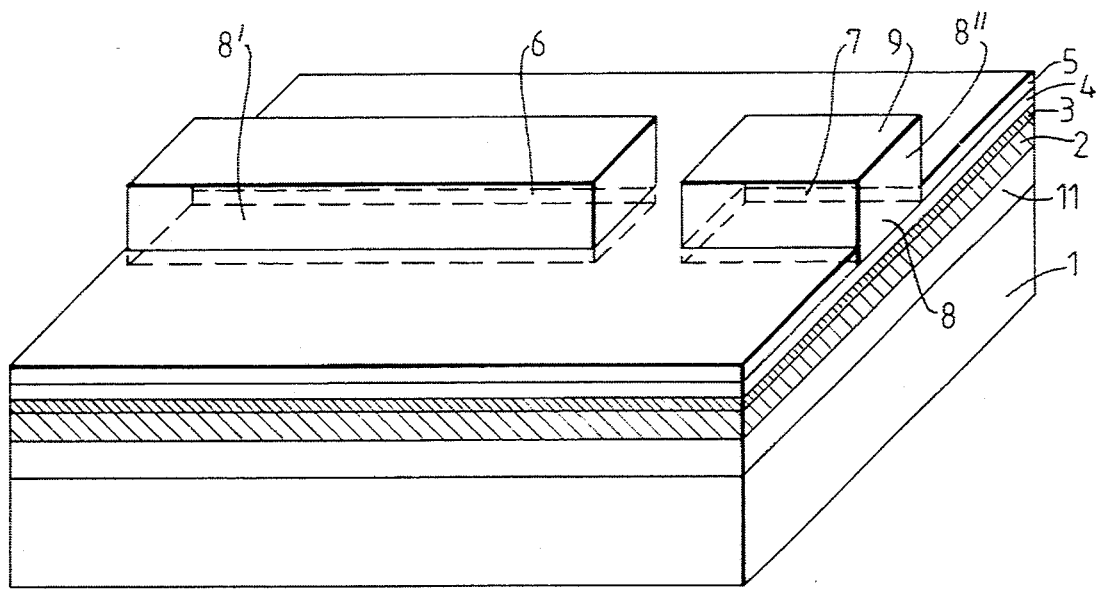
FIG. 1 is a schematic perspective view of a partially completed device according to a first embodiment of the invention.

The principal features of a first embodiment of the invention are shown in FIGS. 1, 2, 2A and 5. The structure of this embodiment is similar to that of a ridge-waveguide laser. The photodiode absorbing layer is an unpumped extension of the gain layer of the laser amplifier. In the embodiment shown, the 'active' layer is continuous, and this results in good optical coupling and low optical feedback at the interface between the amplifier and the photodiode. Improved coupling and reduced feedback are further facilitated by the incorporation of a waveguiding layer immediately beneath the active layer, the waveguiding layer serving to force the peak of the optical field deeper into the structure. The presence of the waveguiding layer also serves to reduce the polarisation sensitivity of the device because it minimises the difference between TE and TM confinement factors, for both transverse and lateral directions. Good electrical isolation between the optical preamplifier and the photodiode is essential for the correct operation of the device. In the embodiment shown in FIG. 1, a p-n-p junction sequence is formed between the amplifier and the detector.

The construction of a device according to the first embodiment is as follows. The device is grown on an n-type indium phosphide (InP) (100) substrate 1. A buffer layer 11 of InP, 2 $\mu$m thick and doped n-type to about $10^{18} cm^{-3}$ is first grown on the substrate. Next a waveguiding layer 2 of InGaAsP ($\lambda b = 1.1$ $\mu$m) 0.4 $\mu$m thick, doped n-type to about $10^{18}$ $cm^{-3}$ is grown on the buffer layer. On the waveguiding layer there is grown an active layer 3 of InGaAsP ($\lambda b = 1.59$ $\mu$m) 0.1–0.2 $\mu$m (typically 0.15 $\mu$m) thick and doped n-type to between $10^{16}$ and $6 \times 10^6$ $cm^{-3}$. On the active layer there is grown a spacer layer 4 of InP, 0.1 $\mu$m thick, also doped n-type to between $10^{16}$ and $6 \times 10^{16}$ $cm^{-3}$.

To this level the layers can be grown on the wafer by any suitable epitaxial growth method, for example VPE, MBE or LPE, but atmospheric pressure MOVPE is preferred.

The next layer to be formed is a dielectric mask 5. The mask is preferably silicon nitride, formed by pyrolytic deposition, and has a thickness of 0.1 to 0.2 $\mu$m. Silox can be used in place of the silicon nitride, although it has previously been shown to have inferior performance as a diffusion mask.

The next step is the formation of the channel and isolation region dielectric mask, with windows 6 and 7 in the dielectric 5 at the sites of the amplifier and the detector. Conventional lithography, photo or electron beam, is used to define the mask pattern, the silicon nitride conveniently being etched with either an HF wet etch or in a $CF_4$ plasma. As will be noted from the Figures, the amplifier and detector portions are aligned with each other, but separated by an isolation region. The length of the isolation region will normally be in the range 1 to 5 μm, thereby minimising the attenuation due to absorption between the amplifier and the detector. Depending upon the precise configuration of the device, it may be possible to use a separation as low as 0.5 μm but this is believed to be at the limit for satisfactory electrical isolation. However, there is an advantage in using separations larger than the minimum, even larger than 5 μm, and that is that spatial separation between the amplifier and the detector acts to filter out some of the spontaneous noise generated by the amplifier. The figures plotted in the curves in FIGS. 3 and 4 were obtained from a device in which the separation and ridge widths were both 2 μm, and this was found to be satisfactory.

Figure 5:
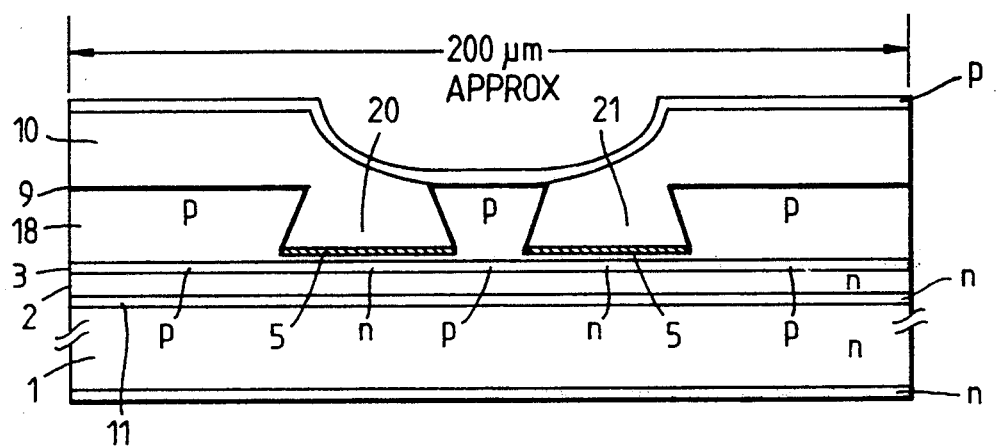
FIG. 5 is a schematic vertical cross section of a device according to the invention.

The channel regions, 20 and 21, which can be seen in FIG. 5, are fairly narrow, at 6 μm wide, so that there is no risk of polycrystalline overgrowth during the subsequent selective epitaxial growth stage even when an atmospheric pressure system is used. The channel width could be increased to 10 μm and possibly to about 20 μm before polycrystalline overgrowth is likely to occur, but to avoid any risk of uncontrolled growth we prefer to use channel widths in the range 4 to 10 μm, or more preferably in the range 5 to 8 μm. Even if polycrystalline overgrowth does occur on the dielectric, the device should still operate satisfactorily provided that such overgrowth does not form a continuous electrical path between the central ridge and the adjacent 'wing' ridges 18. Conversely, narrower channels are preferably avoided in the interests of easy and high yield processing.

The choice of ridge width is again made primarily with a view to easy and high yield processing. In order to reduce both the capacitance of the PIN photodetector and the operating current necessary for the required current density in the laser amplifier, it is preferable to have a narrow ridge width, for instance the basal ridge width being not more than 10 μm. Unfortunately, if the windows 6 and 7 are made too narrow, it becomes difficult to ensure a high yield in the lithographic process. The 2 μm ridge width of the prototype devices was chosen with a view to certain success in the lithographic process and hence high yield. Narrower ridge widths, for example 1.9, 1.8, 1.7, 1.6, 1.5 μm are likely to be moderately easy to make, and hence it is proposed that devices with such ridge widths or with ridge widths in that range 1.5 to 5 μm, or more preferably 1.5 to 3 μm, be produced.

Given that the devices according to the invention are primarily designed with speed in mind, there seems to be little point in going to ridge widths much wider than 2 to 2.5 μm unless one's fabrication facilities are incapable of giving satisfactory yields with such narrow line widths.

After formation of the windows, selective epitaxy was used to grow ridge structures 8' and 8" for the amplifier and detector respectively at the same time forming 'wing' ridges 18. First, an InP layer, 1 to 1.5 μm thick, doped p-type zinc to about $5 \times 10^{17}$ cm$^{-3}$ was grown in both windows. On top of the ridge layer 8, a contact layer 9 of InGaAs, also doped p-type with zinc to about $10^{19}$ cm$^{-3}$ to give an ohmic contact, was grown to a thickness of about 0.1 μm. Again, any suitable epitaxial growth method may be used, but we prefer atmospheric pressure MOVPE.

The length of the first ridge structure 8' is preferably at least ten times that of the second ridge structure 8". Preferably, the length of the second structure 8" lies in the range 30 to 60 μm and the length of the first structure 8' lies in the range 300 to 650 μm.

During growth of the p-InP ridge layer 8, zinc diffuses through the spacer layer 4 and into the active layer, type converting them both. Using atmospheric pressure MOVPE to grow the ridge and contact layers takes at least 15 minutes at 650° C. Under these conditions, zinc, which is a very fast diffusing species, is able to move sufficiently to provide the desired type conversion of the active layer during the growth process and without the need for a separate heat treatment to drive the dopant.

The high mobility of zinc at the growth temperature of the layers 8 and 9, which is normally a disadvantage, is here used to advantage. With careful selection and control of the n-type doping levels of the spacer, active and waveguiding layers, and similarly careful selection and control of the p-type doping level in the InP ridge layer 8, it is possible to produce a self limiting diffusion system. By choosing to heavily dope the waveguiding layer 2 and only lightly dope the active and spacer layers 3 and 4, zinc from the intermediately doped ridge layer will effectively diffuse only as far as the interface between the active layer 3 and the waveguiding layer 2. The initial light n-type doping level of the active and spacer layers 3 and 4 is also chosen to ensure that the secondary zinc diffusion front (which has a concentration of about $10^{16}$ cm$^{-3}$) does not type convert the whole of the active layer, and ensures the correct placement of the lateral p-n junction in that layer.

It will be noted that this is a particularly simple fabrication process, in which no semiconductor etching is required. A lateral p-n junction is formed by diffusion of acceptors from the overgrowth only in areas that are not masked, and this results in low PIN capacitance because the junction area is limited by the ridge width and not by the chip width as in conventional structures. Similarly, good electrical isolation is ensured between the amplifier and the detector because of the presence of a back-to-back pn junction therebetween. A further benefit of the lateral p-n junction is that current spreading under the preamplifier ridge is restricted, and this results in a reduction in the drive current requirement. Reducing the strip width will further reduce amplifier drive current and PIN capacitance.

Figure 2:
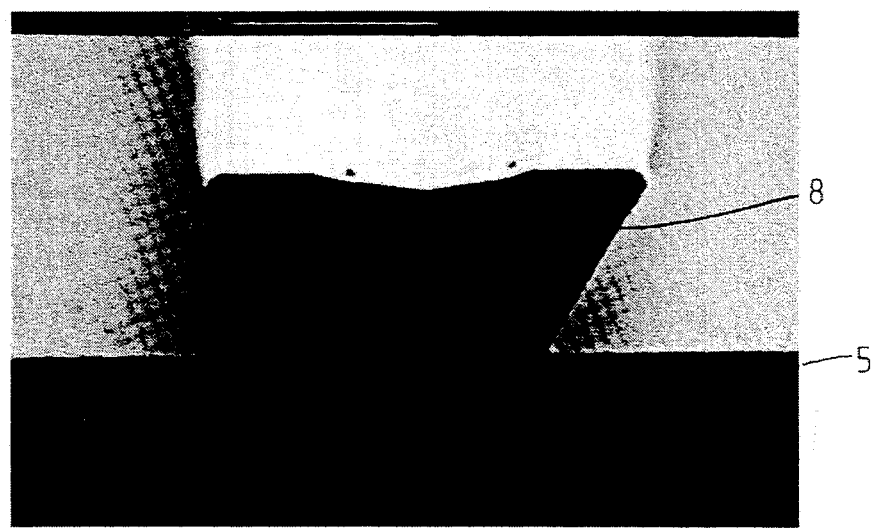
FIG. 2 is a scanning electron micrograph of the ridge of a device of the type shown in FIG. 1.
Figure 2A:
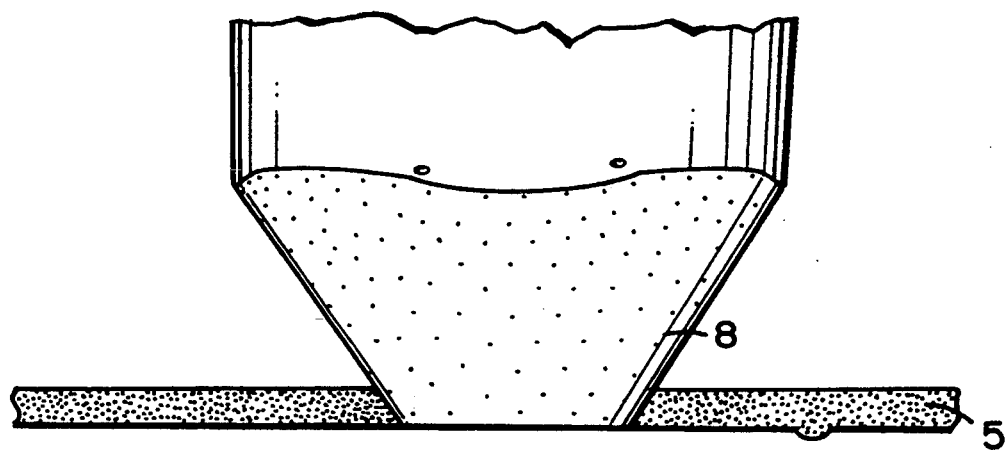
FIG. 2A is schematic perspective view of the ridge of a device of the type shown in FIG. 1.

A scanning electron micrograph of a cleaved section of the structure resulting from this process is shown in FIG. 2: note the good ridge shape and clean mask dielectric. The dielectric mask 5 can be left in place because no growth occurs on it.

To ensure low bondpad capacitance, a polyimide spacer layer 10, 2–3 μm thick, is formed over the ridges and mask dielectric. A relatively wide contact window (ie one wider than the ridge ), typically about 10 μm wide, requiring no critical alignment, is all that is needed in this layer since the dielectric mask 5 effectively self-aligns the top contact.

Unlike conventional ridge waveguide laser processing, in which the ridge is defined by etching channels into a planar structure, it is not necessary in the present process to form a contact window which is narrower than the ridge itself and which needs to be aligned very accurately between the borders of the ridge. The presence of the dielectric channel mask 5, to which the ridge is self-aligned, means that there is no risk of the contact metallisation 'shorting' to semiconductor in the channel region. While it is preferred to carry out a partial polyimide etch so that only the ridge is exposed, it is not essential that the etch be stopped at that stage. If the 'via' opened in the polyimide exposes the silicon nitride or silox dielectric 5, subsequent filling of the via with contact metallisation will not normally prevent the device from working, it will normally only lead to an increase in capacitance and hence reduction in maximum operating speed.

The polyimide is etched using an oxygen plasma. It is possible, during etching, visually to monitor etching progress and to stop etching when the top of the ridge is exposed. Such a curtailment of etching is assumed for the structure shown in FIG. 5. Note that the full width of the contact layer 9 of the ridge is useable—unlike in previous ridge laser processes, and this means that the device can have a lower resistance.

If there is good control of the polyimide processing, it is not essential to retain the oxide or nitride dielectric layer 5, the layer 5 being removed after the completion of the selective epitaxial growth and before the polyimide layer is formed.

If there is good control of polyimide processing, it is possible not only to etch away the oxide or nitride dielectric, but also to do away with the spacer layer 4—that is, to have the active layer 3 as the top layer of the planar. Omission of the spacer layer is likely to lead to increased surface recombination, increased loss and greater unreliability, and as such is not a preferred option. Nevertheless, should one want to use such a structure, these problems are likely to be miniraised if the active layer is covered directly with the polyimide rather than retaining the oxide or nitride. Clearly, one would not want to omit the spacer layer if one could not ensure that the metallisation would remain remote from the active layer.

After the polyimide etch, the top contact metallisation is applied. For this we use 1000 Å titanium followed by 3000 to 4000 Å of gold, which is subsequently patterned by etching. Alternatively, a titanium platinum, gold metallisation may be used, patterned using a lift-off process.

The base metallisation is again titanium/gold or titanium/chromium/gold.

In the above-described embodiment and elsewhere in this specification the thicknesses quoted for the semiconductor and dielectric layers are exemplary only. Those skilled in the art will in general be aware of the considerations which are involved in choosing layer thickness, composition and doping levels. The following notes are intended to assist in the selection of these values for these variables.

The thickness of the active layer is determined by waveguiding and gain considerations, and will typically be in the range 0.1 to 0.2 $\mu$m, e.g. 0.15 $\mu$m.

The bandgap-equivalent wavelengths quoted for the quaternary layers are those suitable for operation at 1.55 $\mu$m. Again, those skilled in the art will be aware of the factors involved in selecting the composition of alloy layers in lasers, laser amplifiers and photodiodes. For the active layer 3, it is preferable to choose a composition having a bandgap-equivalent wavelength $\lambda$b slightly longer than the desired operating wavelength. For 1.55 $\mu$m operating wavelength we used a quaternary having a $\lambda$b of 1.59 $\mu$m. Conversely, the material for the waveguiding layer 2 should of course have a $\lambda$b shorter, and preferably significantly shorter than the desired operating wavelength.

Prototype devices fabricated using this technique were cut to various lengths. PIN leakage current was typically <1 $\mu$A at $-3$ V and PIN capacitance measurements at 1 MHz gave a value of 5 pF/mm. Fabry-Perot lasers cut from the wafer and with a length of 250 $\mu$m had threshold currents in the range 25-30 mA, and resistances of 3 to 4 ohms.

A sample device with a preamplifier section having a length of 600 $\mu$m and a PIN section length of 35 $\mu$m was mounted in a high speed package. The package incorporated a Wiltron K-connector micros trip launcher, to enable characterisation up to 46 GHz. A microstrip stress relief contact was used to make direct contact with the PIN section, ensuring a low series inductance. Measurement of the scattering parameter S11 using a HP8510 network analyser up to a frequency of 20 GHz indicated approximate values of PIN capacitance and series inductance of 0.20 pF and 0.3 nH respectively.

Figure 3:
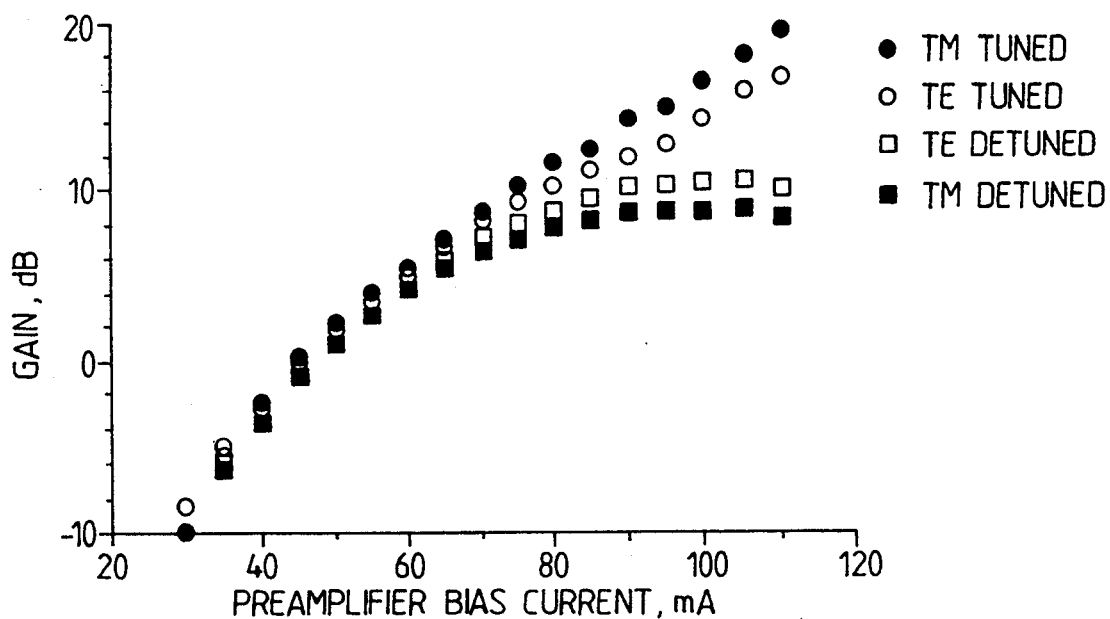
FIG. 3 is a graph showing plots for tuned and detuned gain as a function of preamplifier bias current for TE and TM polarisations.

Gain measurements were performed on this device by comparing the PIN photocurrent when the preamplifier was turned on, with the photocurrent observed when the preamplifier and PIN were connected together, and used as one long photodetector (with an assumed quantum efficiency of 100°/o). This method gives values for gain which are independent of input coupling loss, which is considered appropriate because input coupling loss can vary widely for different launch arrangements. FIG. 3 shows tuned and detuned gain as a function of preamplifier bias current for $-30$ dBm of coupled power at wavelengths around the gain peak (1530 nm), for both TE and TM polarisations. Fabry-Perot resonance effects are apparent in this prototype device because the input facet was not coated, and because the short PIN length allowed a significant amount of optical feedback from the uncoated PIN facet. The polarisation sensitivity observed at high preamplifier bias was caused by higher modal reflectivity for TM polarisation. The single pass gain (not shown), however, displayed no appreciable polarisation sensitivity. A maximum gain of 20 dB was measured just below the threshold current of the device (110 mA).

Figure 4:
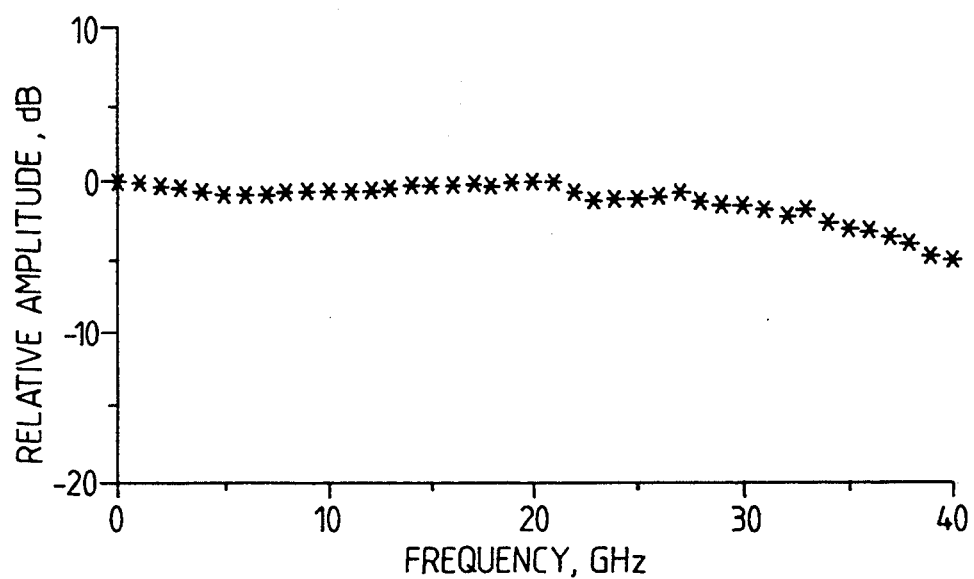
FIG. 4 is a graph showing the frequency response in GHz at 70 mA preamplifier bias and −4 V PIN bias.

Frequency response measurements were performed using a heterodyne system consisting of an extended cavity laser and a DFB laser operating at 1530 nm. The beat frequency was swept by current tuning the DFB laser, which resulted in a 0.5 dB power variation over a 40 GHz sweep range. A 50 MHz-50 GHz power sensor with a sensitivity of $-70$ dBm (HP8487D) was used to measure rf power from the device, via a Wiltron V-type bias tee (0.1-60 GHz). This method avoids problems caused by linewidth fluctuation of the DFB laser as it is tuned, which makes the use of spectrum analysers difficult. Frequency points were obtained by using a wavemeter to measure the frequency of each laser and then computing the difference, which could be done with a resolution of 100 MHz. FIG. 4 shows the amplitude-frequency characteristic for this device after correction for input power variation and residual loss, at a preamplifier bias of 70 mA and a PIN bias of $-4$ V. From this figure, a 3 dB bandwidth of 35 GHz is observed.

Performance of the device is improved if the input facet, on the laser amplifier, is anti-reflection (AR) coated. Similarly, AR coating of the back facet of the PIN photodetector improves performance. Preferably, both the input facet, of the laser amplifier, and the back facet, of the PIN photodiode, are AR coated. Preferably the AR coating or coatings reduce the respective facet reflectivity to less than 10°/o, more preferably to no more than 1°/o, and most preferably to less than or equal to 0.1°/o.

Of course the above described process is useful not just in the fabrication of integrated laser amplifier PIN photodetector devices, but also in the fabrication of ridge waveguide semiconductor lasers, both Fabry-Perot and DFB, and discrete semiconductor laser amplifiers, and also in the fabrication of edge coupled PIN photodetectors—discrete or integrated.

As was mentioned earlier, Fabry-Perot ridge waveguide lasers were cut from a prototype wafer, and such devices having a length of 250 μm and ridge widths of 2 μm had threshold currents of 25–30 mA and resistances of 3–4 ohms. Such figures are, we believe, very impressive (the threshold currents are about 10°/o less than one would expect) given the comparative simplicity and high yield of the process. With high quality anti-reflection coatings on the facets such devices perform well as travelling-wave semiconductor laser amplifiers.

Similarly, with the addition of a grating, formed on an additional wide bandgap quaternary layer grown on the active layer and which could be a replacement for or an addition to the spacer layer 4. Preferably, but not essentially, a thin spacer layer of InP is grown over the new quaternary layer. The grating is formed before growth of the ridge layers, the process could be used to produce DFB lasers.

Exactly the same process could also be used to form PIN photodetectors without associated laser amplifiers. A further improvement in the performance of such photodetectors could be achieved, however, by replacing the quaternary active/absorption layer of with lower bandgap material, for example InGaAs (lattice matched to InP), which has a bandgap of about 0.7 eV, and which has higher optical absorption than the quaternary.

Such PIN photodetectors are preferably provided with an AR coating, at least on the rear facet. Discrete photodetectors are also preferably provided with an AR coating on their input facet. The previously mentioned reflectivities and reflectivity ranges also apply to the coatings on these PIN photodetectors.

Figure 6A:
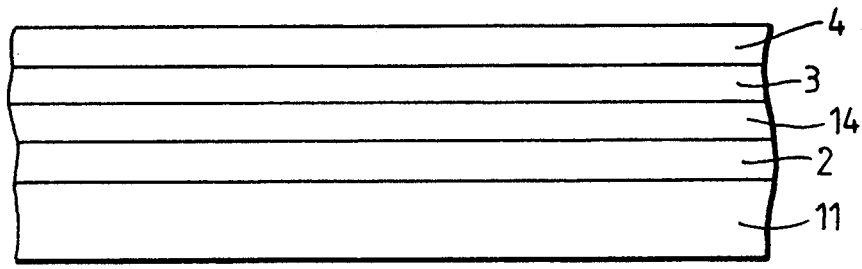
FIGS. 6a–6c are schematic drawings of an alternative embodiment of the inventions.
Figure 6B:
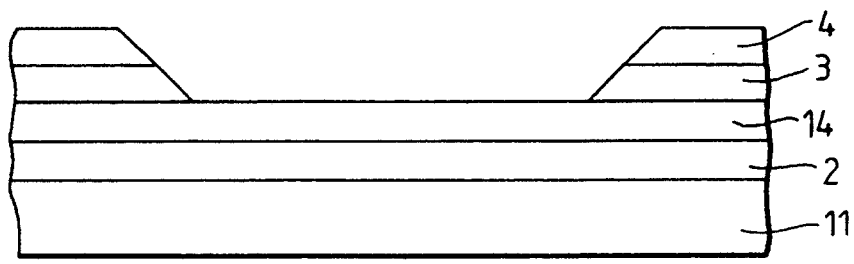

In a second embodiment, illustrated schematically in FIGS. 6A–6B, part of the active layer is removed between the amplifier and the photodetector, amplified signals being carried therebetween only by a passive waveguide. FIG. 6a is a schematic vertical cross-section along the length of a device, showing the planar construction prior to etching. It will be noted that between the waveguide layer 2 and the active layer 3 there is now an additional buffer layer 14. This buffer layer, while not essential, does give flexibility in design of the amplifier/detector interface. The buffer layer comprises InP about 0.1 μm thick, doped n-type to about $10^{18}$ with sulphur (the same as the waveguide).

In FIG. 6b the same structure is shown after etching has removed a portion of the InP spacer layer and the underlying active layer. The next step is to form a dielectric layer, preferably of silicon nitride, and pattern as before. Selective epitaxy is then used, again as before, to grow the ridge structure. The extra buffer layer, which is between the active layer and the underlying waveguiding layer, is doped n-type to the same level as the waveguide, that is about $10^{18}$ cm$^{-3}$ the other carrier concentrations being as before. Therefore, when the ridge is grown, active layer p-n junctions are only formed in the terminal ends and not in the intermediate portion.

Figure 6C:
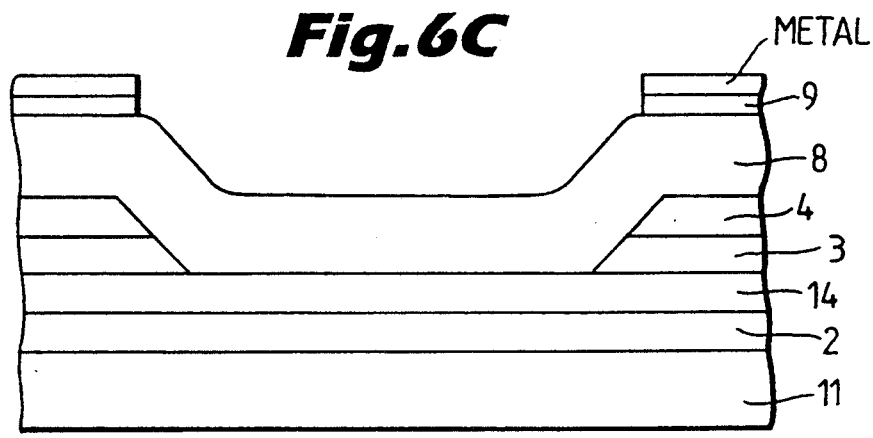

Polyimide insulation can be applied as before (not shown in FIG. 6c), with separate electrode metallisations for the amplifier and for the detector, FIG. 6c.

The rib loaded waveguide portion between the amplifier and the detector may also be provided with an electrode by means of which the refractive index of the waveguide portion may be varied. This is particularly useful if a grating filter is integrated in the waveguide portion between the amplifier and the detector, as in this way the filter may be tuned. Additionally or alternatively, the waveguide portion between the amplifier and the detector may branch. Such a branch or branches may serve to funnel extra signals to the detector, or may fan out the output of the amplifier to two or more detectors.

Figure 7:
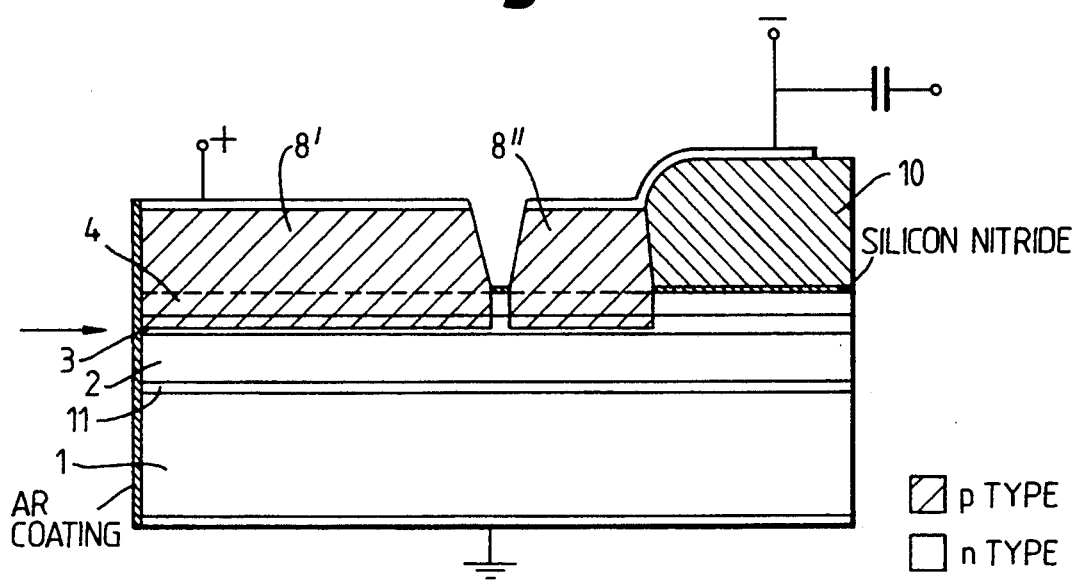
FIG. 7 is a schematic vertical cross section of a further alternative embodiment of the invention.

In a third embodiment, illustrated schematically in FIG. 7, the photodiode is not continuous as before. Instead, the ridge is truncated before the edge of the chip. This is accomplished easily by changing the pattern in the dielectric mask (so that it is not open to the edge as before) prior to selective epitaxy. This has three benefits:

—light leaving the end of the PIN is not laterally guided, so it diffracts to the edge of the chip. Any reflected light at this point is unlikely to get back into the guide, therefore low reflectivity is achieved without an anti reflection coating on the back facet.

—the photodiode pn junction is now fully passivated i.e. along all four edges of the photodiode, by the silicon nitride mask, which results in greater potential reliability. Previously, the back of the photodiode was defined by the cleave, which resulted in an exposed pn junction.

—the photodiode length is now fully determined by the silicon nitride mask. Previously, short PIN lengths were difficult to achieve because the length was determined by the cleave position. This position was difficult to place precisely, and any slight deviation of the cleavage plane from the mask orientation resulted in different PIN lengths along a bar cut from the wafer. Now the PIN length is simple to control with great precision, which is important for low capacitance and therefore high speed.

The method according to the invention finds further application in the field of integrated optics and optical signal processing. Devices for such applications may consist of one or many laser amplifier segments and one or more detector segments.

In an alternative fabrication method, the active layer of the laser amplifier and the absorption layer of the photodiode are formed of different materials (smaller bandgap, e.g. 50 nm less, material being used for the absorption layer). In such a method, selective etching followed by selective epitaxy is used to grow either a replacement laser active region or, more preferably, to grow a replacement absorption layer. The second variant is preferable, because selective epitaxy is likely to be more successful with a larger growth area. The process is as before (except for the bandgap of the active layer) up to the growth of the silica or silicon nitride dielectric layer. That dielectric is then etched either to open a window over the active region of the laser, the spacer (if used) and active layer removed by etching, and a replacement active layer of smaller bandgap grown by selective epitaxy (a replacement portion of spacer layer also being grown if necessary). Then a further dielectric etch is carried out to form a mask preparatory to selective epitaxial growth of the ridge. Further processing is as before.

In the preferred alternative, the initial dielectric etch exposes all but the active area of the laser. The spacer layer, if used, and the active layer are then removed by etching. Selective epitaxial growth is used to 'replace' the active layer with a smaller bandgap e.g. (50 nm less) quaternary layer. The spacer layer if required is then regrown. A dielectric layer is reformed, after first removing the remaining dielectric if necessary, and patterned as before. Further processing is as before.

Too large a bandgap difference between the materials used to form the active layer and the absorption layer should be avoided so as not to create unwanted strong reflectors.

To fabricate a plurality of devices from a single wafer, cleaving can be used. However, the polyimide film is continuous and can be difficult to break. It is therefore preferable to etch the polyimide away along cleave positions, prior to cleaving. Furthermore, the overgrowth of the selective epitaxial layers is prevented in these cleave positions to enhance the chances of the cleave propagating in the right place (a channel is formed by the selective epitaxy which weakens the crystal along this line). Scribe channels can reduce flexibility in device length, but in embodiments of the present invention they can be placed along the length of a device (for instance every 250 $\mu$m) so that different lengths can be cut.

A further problem which can be caused by the polyimide is that metal bondpads tend not to stick very well to polyimide. A possible solution to this requires the inclusion of an intermediate layer that sticks to both metal and polyimide e.g. silicon nitride. This would work, but requires extra process complexity (an extra stage of photolithography). It has been found that a simple pre-etching treatment of the polyimide prior to metal deposition increases the yield of bonding success. An aqueous solution of potassium hydroxide can be used. This is a known liquid phase etchant for polyimide and the intention in the present context is merely to remove a few hundred Angstroms depth of polyimide material. (It may be that alternative etching techniques might be substituted, such as gas phase etching.) If an aqueous solution of potassium hydroxide is used, a suitable concentration would be at least 0.2 mole.

Optoelectronic devices according to embodiments of the present invention can be designed to present a generally planar upper surface by depositing the spacer layer 10 to a depth comparable to that of the ridge structure or structures. It will be understood however that this is a physical characteristic rather than an indication that the device is fabricated according to "planar" techniques as generally understood by those skilled in this art.

I claim:

1. An optoelectronic semiconductor device comprising:
   a first epitaxial layer grown on a semiconductor substrate,
   a second epitaxial layer grown on said first layer, said second epitaxial layer having a higher refractive index than that of the first layer and an optical input/output, and
   a third epitaxial layer in the form of a ridge structure selectively grown on or over said second layer, wherein said first; epitaxial layer is of a first conductivity type, said third epitaxial layer is of a second conductivity type and a p-n junction is formed in said second epitaxial layer between a region of material of said second conductivity type, which is aligned beneath said ridge structure, and adjacent regions of said first conductivity type of said second layer, and having an electrical output/input across said p-n junction.

2. A device as claimed in claim 1 wherein said first conductivity type is n-type and said second conductivity type is p-type.

3. A device as claimed in claim 1 wherein said first epitaxial layer is a waveguiding layer and said second epitaxial layer is an active layer.

4. A device as claimed in claim 1 wherein said first layer is doped to a first carrier concentration, the regions of said first conductivity type of said second layer are doped to a second carrier concentration lower than the first, and the third layer is doped to a carrier concentration intermediate said first and second concentrations.

5. A device as claimed claim 1 wherein a fourth epitaxial layer lies between said second and said third epitaxial layers, the fourth epitaxial layer having been grown on the second, the third epitaxial layer having been grown on the fourth and said p-n junction also being formed in said fourth layer.

6. A device as claimed in claim 5 wherein said first layer is doped to a first carrier concentration, the regions of said first conductivity type of said second and fourth layers are doped to a second carrier concentration lower than the first, and the third layer is doped to a carrier concentration intermediate said first and second concentrations.

7. A device as claimed in claim 1 further comprising a dielectric mask used in defining the position of the ridge structure.

8. A device as claimed in claim 7 wherein the mask comprises silicon nitride.

9. A device as claimed in claim 1 wherein said ridge structure has a basal width of 10 $\mu$m or less.

10. A device as claimed in claim 9 wherein said ridge structure width is between 1.5 and 5 $\mu$m.

11. A device as claimed in claim 10 wherein said ridge structure width is between 1.5 and 3 $\mu$m.

12. A device as claimed in claim 11 wherein said ridge structure width is between 1.5 and 2.5 $\mu$m.

13. A device as claimed in claim 1 wherein said ridge structure is bordered by channel regions.

14. A device as claimed in claim 13 wherein said channel regions have widths of between 4 and 10 $\mu$m.

15. A device as claimed in claim 13 wherein said channel regions have widths of between 5 and 8 $\mu$m.

16. A device as claimed in claim 1 further comprising a cleaved facet, the facet having an anti-reflection coating.

17. A device as claimed in claim 16 further comprising at least one additional cleaved facet, the or each additional cleaved facet having an anti-reflection coating.

18. A device as claimed in claim 1 further comprising a second ridge structure, wherein said second ridge structure has aligned beneath it a second region of said second conductivity type material in said second epitaxial layer, and wherein a p-n junction is formed in said second epitaxial layers between said second region of material of said second conductivity type and adjacent regions of said first conductivity type of said second layer.

19. A device as claimed in claim 18 wherein said second epitaxial layer is discontinuous between said first and second regions of material, of said second conductivity type whereby these latter first and second regions are electrically isolated one from the other.

20. A device as claimed in claim 18 wherein said second epitaxial layer is of said first conductivity type between said first and second regions of material of said second conductivity type.

21. A device as claimed in claim 18 wherein said first and second ridge structures are separated by at least 2 μm.

22. A device as claimed in claim 18 wherein optical waveguiding means are provided between the first and second ridge structures, whereby said second epitaxial layer beneath the first ridge is optically coupled to said second epitaxial layer beneath the second ridge.

23. A device as claimed in claim 22 wherein an optical filter is provided in the optical path between said first and said second ridge structures.

24. A device as claimed in claim 18 wherein the first ridge structure is at least 10 times the length of the second ridge structure.

25. A device as claimed in claim 18 wherein the second ridge structure has a length in the range 30 to 60 μm.

26. A device as claimed in claim 18 wherein the first ridge structure has a length in the range 300 to 650 μm.

27. A device as claimed in claim 18 wherein a voltage is applied to said first ridge structure to forward bias that portion of the device, and wherein a second voltage is applied in the opposite sense to said second ridge structure to reverse bias that portion of the device.

28. A device as claimed in claim 1 further comprising a spacer layer extending laterally with respect to said ridge structure or ridge structures so as to encourage low bondpad capacitance in use of the device.

29. A device according to claim 28 wherein said spacer layer comprises polyimide material.

30. A device according to claim 1 wherein an end of said ridge structure or ridge structures terminates at a material region which either does not provide a waveguiding effect, or provides a reduced waveguiding effect, such that photons guided along an optical path in use of the device at least partially by the presence of said ridge structure or ridge structures, and exiting the optical path at said end, are generally not reflected back into said path.

31. A device according to claim 30, wherein said ridge structure or structures are fabricated on a planar or substantially planar portion of the device, the optical path lying in or substantially in said planar portion, the ridge structure or structures terminating short of an edge of said planar portion such that the planar portion extends beyond said end of the ridge structure, this providing said absence or reduction of the waveguiding effect, in the extended region of the planar portion.

32. A device according to claim 7, wherein said dielectric mask is also used in defining said extended region of the planar portion with respect to the end of the ridge structure or structures.

33. A device according to claim 28 wherein said spacer layer also extends adjacent to said end of the ridge structure or structures.

34. A device as claimed in claim 30 wherein said end of said ridge structure or ridge structures comprises the distal end of said second ridge structure with respect to said first ridge structure.

35. A device as claimed in claim 28 having a substantially planar structure, said spacer layer having the same, or approximately the same, depth as said ridge structure or structures.

36. An optical receiver including an optoelectronic semiconductor device comprising:
a first epitaxial layer grown on a semiconductor substrate,
a second epitaxial layer grown on said first layer, said second epitaxial layer having a higher refractive index than that of the first layer and an optical input/outputs and
a third epitaxial layer in the form of a ridge structure selectively grown on or over said second layer,
wherein said first epitaxial layer is of a first conductivity types said third epitaxial layer is of a second conductivity type and a p-n junction is formed in said second epitaxial layer between a region of material of said second conductivity types which is aligned beneath said ridge structure, and adjacent regions of said first conductivity type of said second layer, and having an electrical output/input across said p-n junction.

37. A method of fabricating an optoelectronic device, the method comprising the steps of:
(i) growing a first epitaxial layer of a first conductivity type on a semiconductor substrate;
(ii) growing a second epitaxial layer of said first conductivity type on said first layer;
(iii) forming a dielectric layer on or over said second layer;
(iv) derming a pattern in said dielectric layer by selective removal of parts thereof; using selective epitaxy to grow a third epitaxial layer on semiconductor exposed by the patterned dielectric, said third epitaxial layer including at least one ridge structure; and
(v) diffusing a dopant of a second conductivity type from said third epitaxial layer into said second layer thereby selectively type-converting regions of said second layer and forming a p-n junction therein without type converting underlying parts of said first epitaxial layer.

38. A method according to claim 37 wherein said first conductivity type is n-type and said second conductivity type is p-type.

39. A method as claimed in claim 37 wherein a fourth epitaxial layer of said first conductivity type is grown on said second layer before the formation of said dielectric layer, the third epitaxial layer being selectively grown on areas of said fourth layer exposed in the dielectric patterning stage.

40. A method as claimed in claim 37 wherein the substrate comprises a buffer layer on which said first epitaxial layer is grown.

41. A method as claimed in claim 37 wherein said first epitaxial layer as grown is doped to a first carrier concentration, the second epitaxial layer as grown is doped to a second carrier concentration less than said first concentration, and said third epitaxial layer as grown is doped to a third carrier concentration intermediate said first and said second concentrations.

42. A method as claimed in claim 37 wherein the dopant of the second conductivity type is zinc.

43. A method of fabricating an optoelectronic device, the method comprising the steps of:

i) growing a planar structure which is all of a first conductivity type and comprises a waveguiding layer and an active layer overlying said waveguiding layer;

ii) forming an inorganic dielectric layer on said planar;

iii) patterning said dielectric layer to expose underlying semiconductor;

iv) using selective epitaxial growth to grow material of a second conductivity type on said exposed semiconductor, the selective epitaxial growth including at least one ridge; and v) simultaneously with step iv) diffusing dopant from said material of a second conductivity type into the planar to form a predetermined arrangement of p-n junctions therein, including a lateral p-n junction aligned with said ridge.

44. A method as claimed in claim 43 wherein said first conductivity type is n-type and said second conductivity type is p-type.

45. A method as claimed in claim 37 wherein a finished device is produced without the etching of any semiconductor.

46. A method as claimed in claim 43 wherein the optoelectronic device is a laser, laser amplifier or integrated laser amplifier and PIN photodetector and said active layer comprises a quaternary alloy of indium gallium arsenide phosphide.

47. A method as claimed in claim 43 wherein the optoelectronic device is a PIN photodetector and said active layer comprises a ternary alloy of indium gallium arsenide.

48. A method as claimed in claim 37 which further comprises the step of depositing spacer material to either side of said ridge, ridges, ridge structure or ridge structures, to reduce bondpad capacitance in use of the device.

49. A method as claimed in claim 48 wherein said spacer material is first deposited unselectively, then etched back to expose a surface of the ridge, ridges, ridge structure or ridge structures to which electrical contact is to be made in the optoelectronic device.

* * * * *